United States Patent
Chiu et al.

(10) Patent No.: US 10,876,647 B2
(45) Date of Patent: Dec. 29, 2020

(54) QUICK RELEASE PURGE VALVE AND SUBSTRATE CONTAINER USING SAME

(71) Applicant: Gudeng Precision Industrial Co., LTD, New Taipei (TW)

(72) Inventors: Ming-Chien Chiu, New Taipei (TW); Chia-Ho Chuang, New Taipei (TW); Hsin-Min Hsueh, New Taipei (TW)

(73) Assignee: GUDENG PRECISION INDUSTRIAL CO., LTD, New Taipei (TW)

( * ) Notice: Subject to any disclaimer, the term of this patent is extended or adjusted under 35 U.S.C. 154(b) by 70 days.

(21) Appl. No.: 16/237,818

(22) Filed: Jan. 2, 2019

(65) Prior Publication Data

US 2019/0211942 A1 Jul. 11, 2019

Related U.S. Application Data

(60) Provisional application No. 62/615,986, filed on Jan. 11, 2018.

(51) Int. Cl.
| | |
|---|---|
| *F16K 24/04* | (2006.01) |
| *B01D 46/42* | (2006.01) |
| *B01D 46/10* | (2006.01) |
| *F16K 27/02* | (2006.01) |
| *H01L 21/677* | (2006.01) |

(52) U.S. Cl.
CPC .............. *F16K 24/04* (2013.01); *B01D 46/10* (2013.01); *B01D 46/4272* (2013.01); *F16K 27/0209* (2013.01); *H01L 21/67793* (2013.01)

(58) Field of Classification Search
CPC ..... F16K 24/01; F16K 27/0209; B01D 46/10; B01D 46/4272; H01L 21/67793; H01L 21/6735; H01L 21/67359; H01L 21/673; H01L 21/67
USPC ................................. 206/710, 832, 712, 711
See application file for complete search history.

(56) References Cited

U.S. PATENT DOCUMENTS

| | | | | |
|---|---|---|---|---|
| 4,436,201 | A * | 3/1984 | Inaba ................. | G11B 23/0328 206/1.5 |
| 4,582,219 | A * | 4/1986 | Mortensen .............. | E05C 19/06 206/454 |
| 4,709,834 | A * | 12/1987 | Mortensen ............. | B65D 45/16 206/710 |

(Continued)

FOREIGN PATENT DOCUMENTS

KR 20170088411 8/2017

*Primary Examiner* — Chun Hoi Cheung
(74) *Attorney, Agent, or Firm* — WPAT, PC (57) ABSTRACT

A quick release purge valve and a substrate container using the same are provided. The substrate container has a base including a bottom plate, a cover plate, and a quick release purge valve. The quick release purge valve includes a snap plate, a gasket fitting, and a valve element. The snap plate detachably engages with the bottom plate and is at most evenly aligned with the bottom plate. The gasket fitting is disposed between the cover plate and the bottom plate and has an airflow conduit communicating the two plates. The valve element is disposed in the conduit for limiting a flow direction of the gas. The gasket fitting is fixed in the base when the snap plate and the bottom plate are in an engaged state and is removable from the base when the snap plate and the bottom plate are in a disengaged state.

9 Claims, 7 Drawing Sheets

(56) References Cited

U.S. PATENT DOCUMENTS

| | | | | |
|---|---|---|---|---|
| 5,482,161 A * | 1/1996 | Williams | .......... | H01L 21/67369 |
| | | | | 206/711 |
| 6,059,578 A * | 5/2000 | Arnett | .................... | H01R 29/00 |
| | | | | 439/188 |
| 6,187,182 B1 * | 2/2001 | Reynolds | ........... | B01D 46/0004 |
| | | | | 210/136 |
| 6,199,604 B1 * | 3/2001 | Miyajima | ......... | H01L 21/67017 |
| | | | | 141/348 |
| 6,732,877 B2 * | 5/2004 | Wu | .................... | B65D 51/1616 |
| | | | | 206/710 |
| 6,880,598 B2 * | 4/2005 | Haunhorst | ............ | B60C 23/003 |
| | | | | 137/223 |
| 7,201,276 B2 * | 4/2007 | Burns | ............... | H01L 21/67369 |
| | | | | 206/710 |
| 7,455,180 B2 * | 11/2008 | Sumi | .................... | F16K 15/026 |
| | | | | 137/508 |
| 8,091,592 B2 * | 1/2012 | Sato | ...................... | F16K 15/063 |
| | | | | 137/540 |
| 8,403,143 B2 * | 3/2013 | Chiu | ................ | H01L 21/67359 |
| | | | | 206/454 |
| 8,727,125 B2 * | 5/2014 | Tieben | .............. | H01L 21/67379 |
| | | | | 206/454 |
| 9,230,839 B2 * | 1/2016 | Lu | .................... | H01L 21/67359 |
| 9,312,157 B2 * | 4/2016 | Adams | ............. | H01L 21/67373 |
| 9,412,632 B2 * | 8/2016 | Lee | ................... | H01L 21/67359 |
| 10,388,554 B2 * | 8/2019 | Gregerson | ........ | H01L 21/67389 |
| 10,453,723 B2 * | 10/2019 | Kasama | ................. | B01D 46/10 |
| 2005/0247594 A1 * | 11/2005 | Mimura | ............ | H01L 21/67369 |
| | | | | 206/710 |
| 2010/0163452 A1 * | 7/2010 | Lin | ................... | H01L 21/67393 |
| | | | | 206/711 |

\* cited by examiner

Fig. 6

QUICK RELEASE PURGE VALVE AND SUBSTRATE CONTAINER USING SAME

RELATED APPLICATIONS

This application claims priority to U.S. Provisional Patent Application, No. 62/615,986, by Chiu, et al., titled "Quick Replacement Mechanism for Purge Filter," filed Jan. 11, 2018 which is hereby incorporated by reference herein in their entirety.

BACKGROUND OF THE INVENTION

Technical Field

The present invention relates to a quick release purge valve. More particularly, the present invention relates a quick release purge valve applied in a substrate container.

Description of Related Art

Along with the development of technology, the technologies related to semiconductor manufacturing advance rapidly. Among the manufacturing processes, the photolithography process plays a key role. Photolithography involves patterning the light permeable reticle with predefined pattern, projecting the pattern on the reticle onto a wafer by exposing to a light source. As a result, the pattern can be transferred and developed on the wafer. During the photolithography process, any particle attached on the reticle would deteriorate the image quality projected onto the wafer. Especially, with the development trend of miniaturizing the linewidth in recent years, the industry tends to develop smaller, higher logic density chips. The wavelength of the light source used by the photolithography equipment has been narrowed down to the range of extreme ultraviolet light (EUV). As a result, the manufacturers must set stricter standards for the number of particles, the size of particles, and the cleanliness inside the reticle pod.

One known method of maintaining the cleanliness is to install one or more purge valves on the reticle pod and to provide gas flowing through the purge valves. Practically, the gas is provided at a certain flow rate to flow through the purge valve to maintain the replacement rate of the gas in the reticle pod, and to optimize the storage environment for the reticle. The filtration sheet used for filtering out the particles in the gas is disposed at the purge valves of the reticle pod. After several times of use, the filtration sheet must be replaced to maintain the filtration effect.

In one known reticle pod, the filtration sheet, the purge valve, or other related components are assembled and fixed to the base of the reticle pod through one or more screws. When any one of the components, e.g. the filtration sheet, needs to be replaced, the screws need to be removed first and then the bottom plate of the base must be entirely removed as well. After removing all these components, the filtration sheet can then be replaced. After the filtration sheet is replaced, the bottom plate must be reinstalled, and the screws must be driven back into the base. The work of screwing, removing, and reinstalling is quite time consuming, making the component replacement process very inefficient.

SUMMARY

In view of the above-mentioned problems, the present invention is to provide a quick release purge valve and a substrate container using the same, which use a detachable snap plate to increase the convenience of replacing the components.

According to one aspect of the invention, a quick release purge valve configured to allow a gas entering or leaving a substrate container is provided. The substrate container has a cover plate and a bottom plate. The quick release purge valve includes a snap plate, a gasket fitting, and a valve element. The snap plate is detachably engaged to a first opening of the bottom plate and is at most evenly aligned with the bottom plate. The gasket fitting is disposed between the cover plate and the bottom plate and has an airflow conduit communicating the cover plate and the bottom plate. The valve element is disposed in the airflow conduit for limiting a flow direction of the gas. The gasket fitting is configured to be fixed in the base when the snap plate and the bottom plate are in an engaged state and to be removable from the base when the snap plate and the bottom plate are in a disengaged state.

In one embodiment, the snap plate includes a main body and an elastic arm. The main body is used for fixing to one side of the gasket fitting, and one end of the elastic arm is connected to the main body and the other end of the elastic arm is used for engaging with the bottom plate.

In another embodiment, the main body has a circular structure, and the circular structure is configured to surround the gasket fitting and to avoid the airflow conduit.

In yet another embodiment, the gasket fitting has a protruded ring situated on an outer wall of the gasket fitting, and an outer diameter of the protruded ring is larger than an inner diameter of the main body.

In a further embodiment, the bottom plate has a protruded edge and an engaging recess. The protruded edge is used for fixing a location of the main body in the first opening, and the engaging recess is used for engaging with the elastic arm thereby engaging the snap plate with the bottom plate.

In another embodiment, wherein the other side of the gasket fitting is used for pressing against the cover plate in proximity to a second opening of the cover plate, and the gas enters or leaves the substrate container through the first opening, the airflow conduit, and the second opening.

In yet another embodiment, wherein the cover plate has a fitting sleeve surrounding the second opening, and the gasket fitting is used for slidably fitting with or removing from the fitting sleeve.

In a further embodiment, when the gasket fitting is fitted with the fitting sleeve, an air-tight state is formed between the fitting sleeve and the outer wall of the gasket fitting.

According to another aspect of the invention, a substrate container is provided. The substrate container includes an inner box assembly for accommodating a substrate and an outer box assembly for accommodating the inner box assembly. The outer box assembly includes a base and an outer cover. The base includes a bottom plate having a first opening, a cover plate, and a quick release purge valve configured to allow a gas entering or leaving the substrate container. The quick release purge valve includes a snap plate, a gasket fitting, and a valve element. The snap plate is detachably engaged to the first opening and is at most evenly aligned with the bottom plate. The gasket fitting is disposed between the cover plate and the bottom plate and has an airflow conduit communicating the cover plate and the bottom plate. The valve element is disposed in the airflow conduit for limiting a flow direction of the gas. The outer cover is used for engaging with the base to form a sealed state therebetween. The gasket fitting is configured to be fixed in the base when the snap plate and the bottom plate are in an engaged state and to be removable from the base when the snap plate and the bottom plate are in a disengaged state.

In one embodiment, the base further includes a filtration element disposed between the cover plate and the gasket fitting for filtering the gas.

According to the disclosure of the embodiments of the invention, the quick release purge valve and the substrate container using the same use the detachable snap plate to fix the gasket fitting. When the snap plate and the bottom plate are in the disengaged state, the gasket fitting is removable from the base, which facilitates component replacement by the user, and thus the work time can be saved and the work efficiency can be increased. Further, the snap plate is at most evenly aligned with the bottom plate to keep the bottom of the substrate container a flat surface, which is advantageous to the transportation of the substrate container and beneficial for keeping the cleanliness as well.

BRIEF DESCRIPTION OF DRAWINGS

The invention can be more fully understood by reading the following detailed description of the embodiment, with reference made to the accompanying drawings as follows:

FIG. 5b is an exploded view of the quick release purge valve of FIG. 5a; and

DETAILED DESCRIPTION

In the embodiments of the quick release purge valve and the substrate container using the same according to the embodiments of the invention, the quick release purge valve allows the gas entering or leaving the substrate container. The substrate container includes a base having a cover plate and a bottom plate. The quick release purge valve includes a snap plate, a gasket fitting, and a valve element. The snap plate is detachably engaged to a first opening of the bottom plate and is at most evenly aligned with the bottom plate. The gasket fitting is disposed between the cover plate and the bottom plate and has an airflow conduit communicating the cover plate and the bottom plate. The valve element is disposed in the airflow conduit for limiting the flow direction of the gas.

The gasket fitting is configured to be fixed in the base when the snap plate and the bottom plate are in an engaged state, so that the gasket fitting can be prevented from moving out of the base. The gasket fitting is configured to be removable from the base when the snap plate and the bottom plate are in a disengaged state. The snap plate is used such that the convenience of replacing the component can be increased. The complicated process of known method including removing the screws and the bottom plate can be eliminated. The efficiency can therefore be increased, and the time that the substrate container stays off the manufacturing line due to component replacement can be shortened.

Furthermore, since the snap plate is at most evenly aligned with the bottom plate, the bottom of the substrate container can be kept flat, which is advantageous to the transportation of the substrate container and beneficial for keeping the cleanliness as well.

Figure 1:
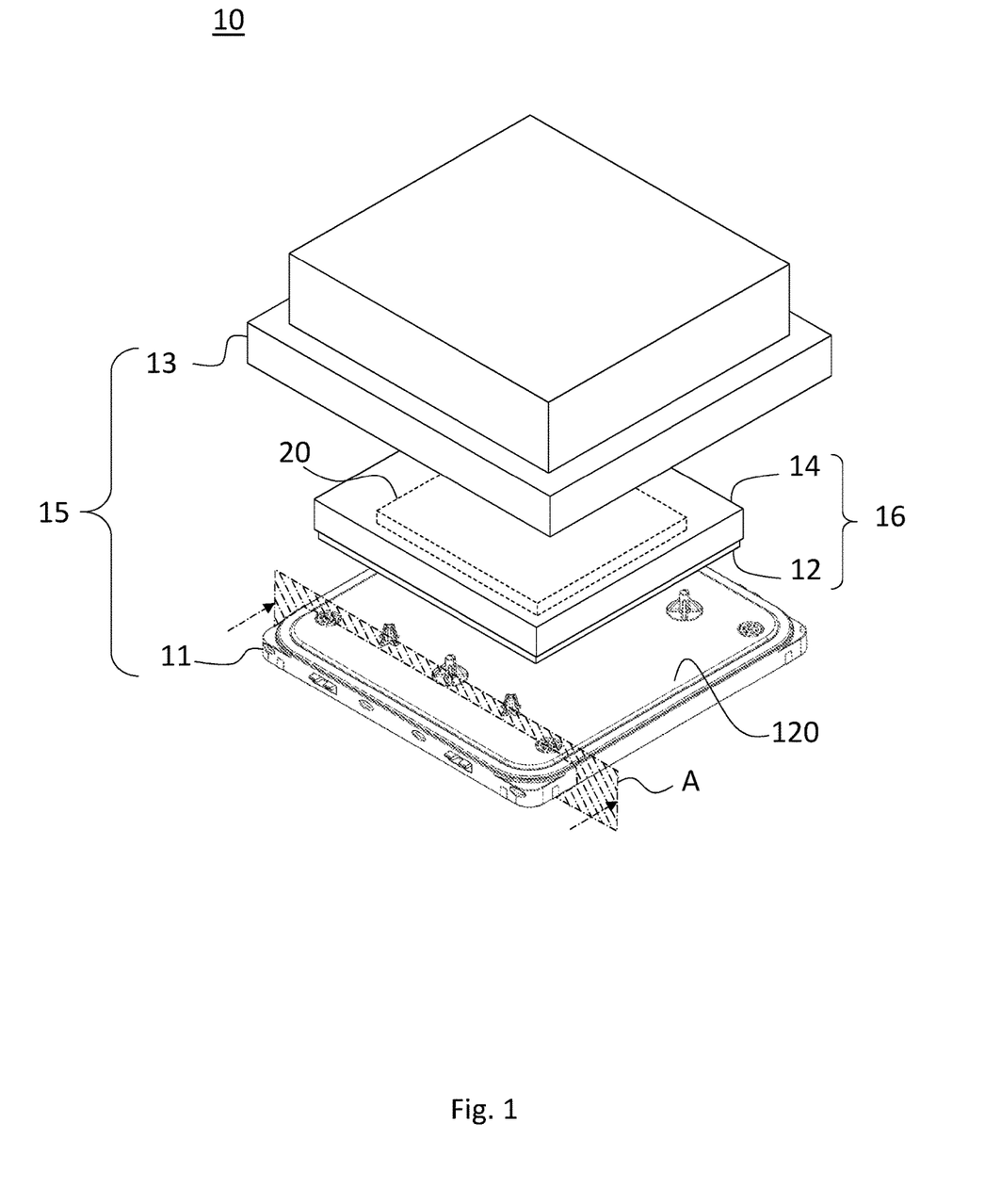
FIG. 1 is a perspective view of a substrate container according to one embodiment of the invention.

Please refer to FIG. 1, which is a perspective view of a substrate container according to one embodiment of the invention. The substrate container 10 includes an outer box assembly 15 and an inner box assembly 16. The outer box assembly 15 is used for accommodating the inner box assembly 16, and the inner box assembly 16 is used for accommodating a substrate 20. The outer box assembly 15 includes a base 11 and an outer cover 13. The outer cover 13 is used for engaging with the base 11 so that a sealed state is formed between them to separate the inside of the outer box assembly 15 from the outside. The required level of cleanliness inside the outer box assembly 15 can be achieved accordingly. The inner box assembly 16 includes a first part 12 and a second part 14 which matches with the first part 12. When the first part 12 engages with the second part 14, an accommodation space is formed between the two parts 12 and 14. The accommodation space is used to accommodate the substrate 20. In the present embodiment, the substrate 20 can be exemplified by an EUV reticle implemented in the patterning process of high-density, high-precision semiconductor. However, in a different embodiment, the substrate 20 can be exemplified by other types of slate components that has a high demand for cleanliness and can be implemented in the semiconductor manufacturing process.

Figure 2:
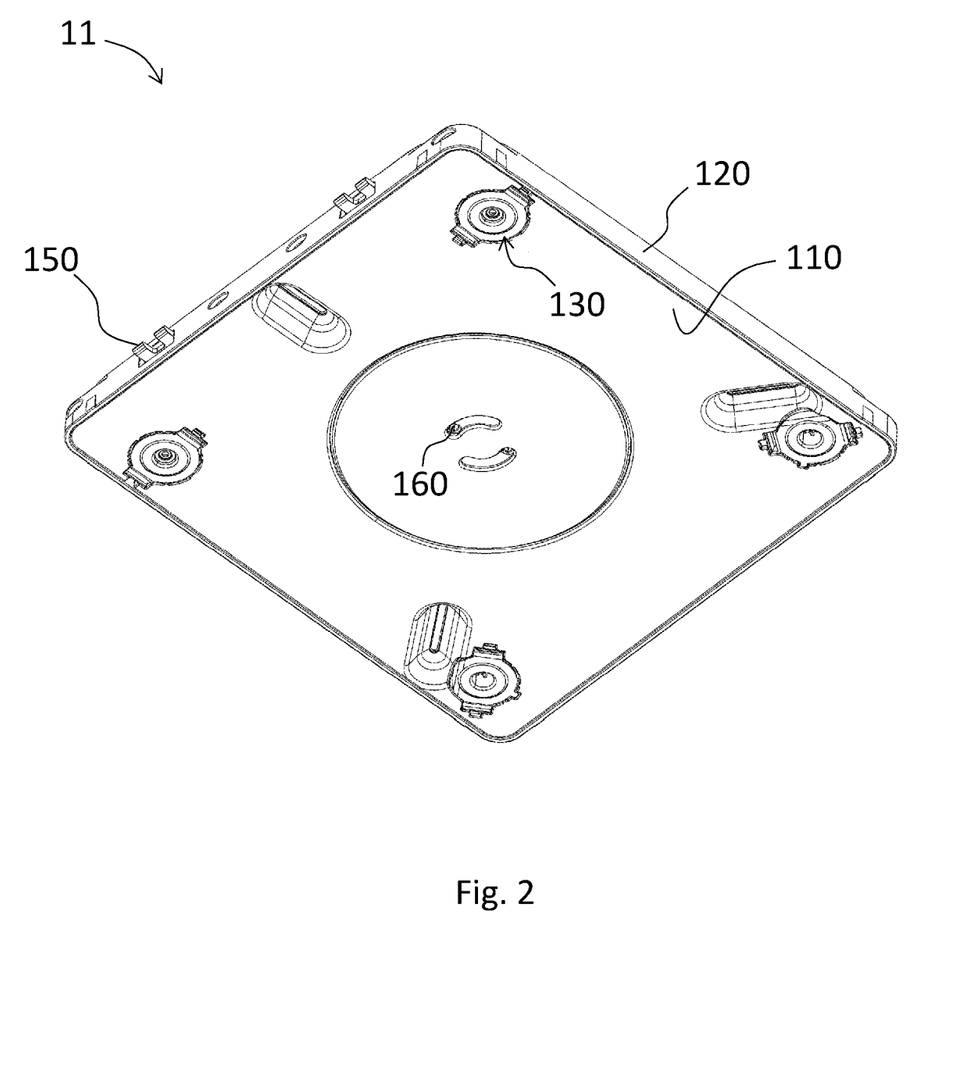
FIG. 2 is a perspective view of the base of FIG. 1 from another view angle.

Please refer to FIG. 1 and FIG. 2 at the same time. FIG. 2 is a perspective view of the base of FIG. 1 from another view angle. In the present embodiment, the base 11 includes a cover plate 120, a bottom plate 110, and a quick release purge valve 130. The cover plate 120 and the bottom plate 110 are configured to be put together and assembled with each other. According to practical product needs, the base 11 can further include a locking element 150 and a driving mechanism 160 for driving the locking element 150, so as to firmly lock the outer cover 13 with the base 11. The quick release purge valve 130 allows a gas entering or leaving the substrate container 10. In the present embodiment, the base 11 is exemplified by including four quick release purge valves 130, as shown in FIG. 2. Two of the quick release purge valves 130 allow the gas entering the substrate container 10 and the other two allow the gas leaving the substrate container 10. However, the number and disposition of the quick release purge valves 130 are not limited hereto, other amount and disposition can also be used in the present invention.

Figure 3:
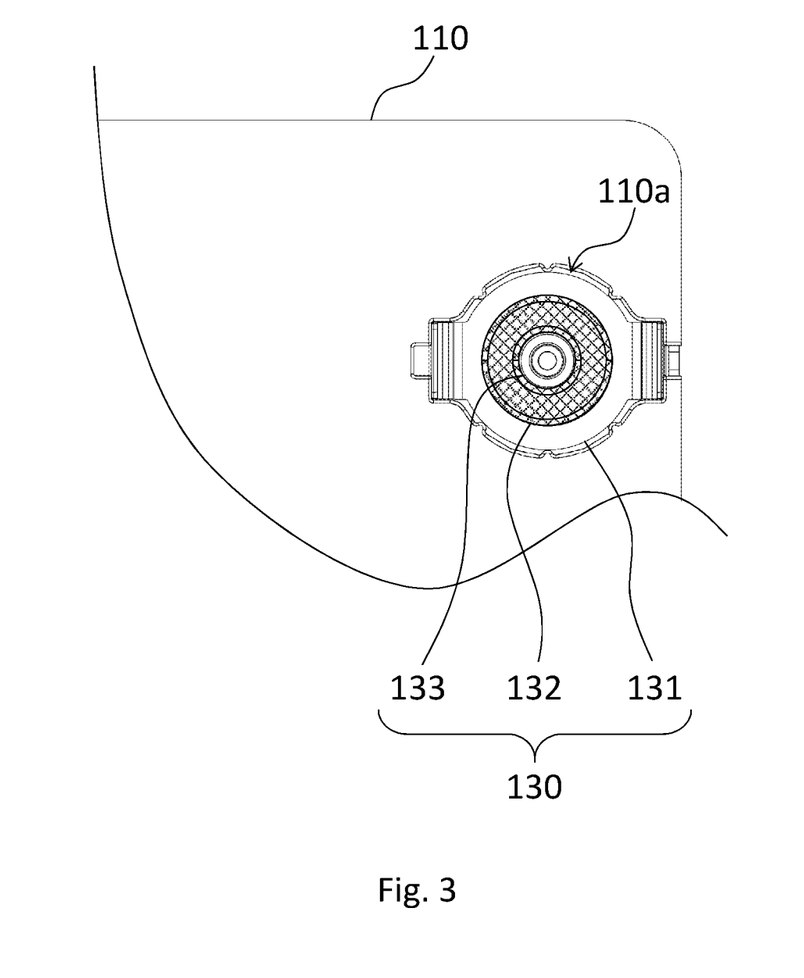
FIG. 3 is an enlarged view of one quick release purge valve of the base of FIG. 2.
Figure 4:
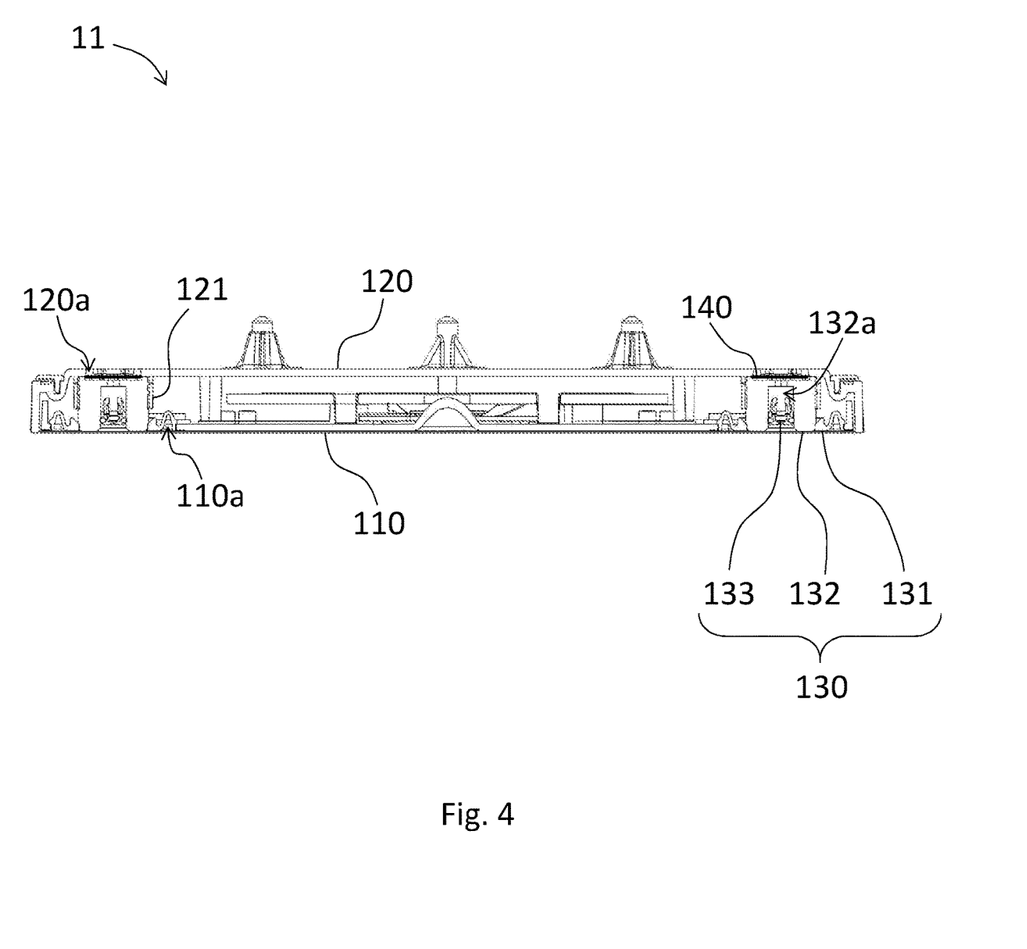
FIG. 4 is a cross-sectional view of the base taken along plane A in FIG. 1.

Please refer to FIG. 3 and FIG. 4 at the same time. FIG. 3 is an enlarged view of one quick release purge valve of the base of FIG. 2. FIG. 4 is a cross-sectional view of the base taken along plane A in FIG. 1. The quick release purge valve 130 of the present embodiment includes a snap plate 131, a gasket fitting 132, and a valve element 133. The bottom plate 110 has a first opening 110a to which the snap plate 131 is detachably engaged. When the snap plate 131 is engaged with the bottom plate 110, the snap plate 131 is at most evenly aligned with the bottom plate 110. In other words, the snap plate 131 is not protruded from the bottom plate 110. The gasket fitting 132 is disposed between the cover plate 120 and the bottom plate 110 and has an airflow conduit 132a communicating the cover plate 120 and the bottom plate 110. The valve element 133 is disposed in the airflow conduit 132a for limiting a flow direction of the gas. When the snap plate 131 and the bottom plate 110 are in an engaged state (as the state of the snap plate 131 and bottom plate 110 shown in FIG. 2, FIG. 3, and FIG. 4), the gasket fitting 132 is fixed by the snap plate 131, and the gasket fitting 132 can be prevented from moving out of the base 11. When the snap plate 131 and the bottom plate 110 are in a disengaged state (such state will be elaborated in the below), the gasket fitting 132 is removable from the base 11 so as to replace the related component in the base 11.

Figure 5A:
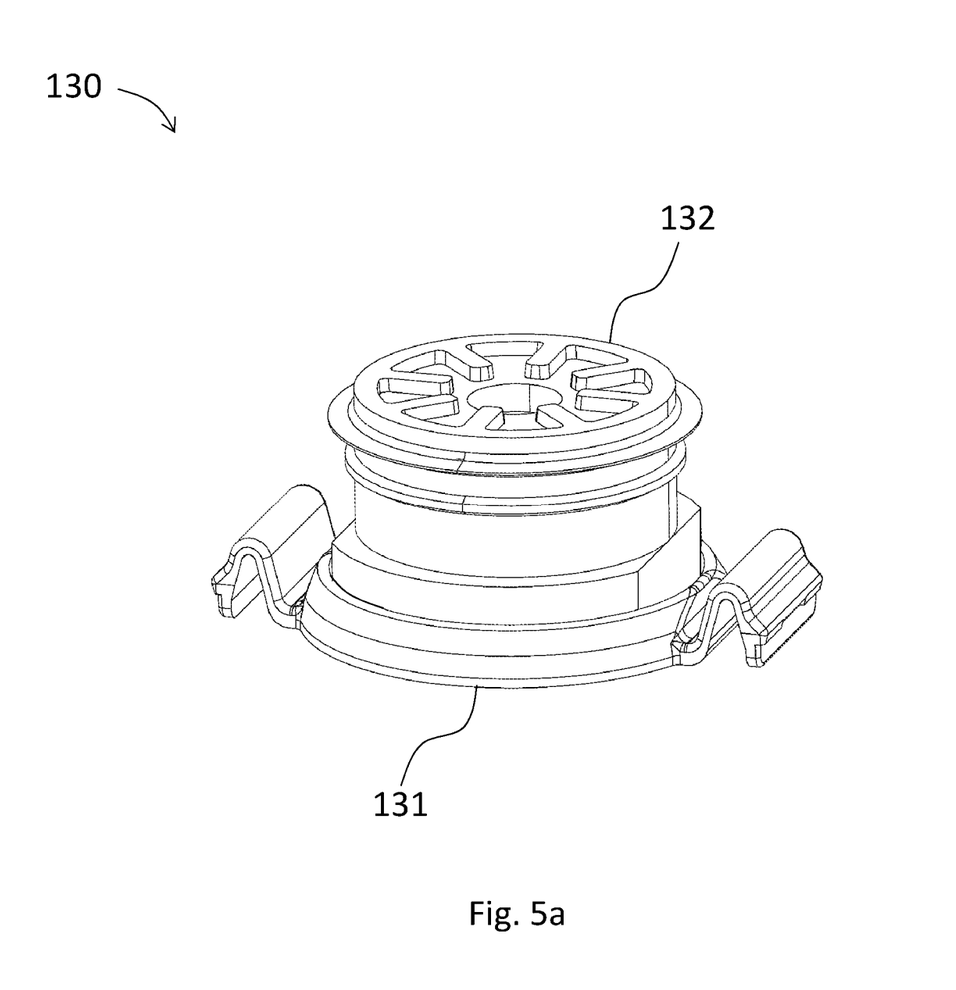
FIG. 5a is a perspective view of the quick release purge valve according to one embodiment of the invention.
Figure 5B:
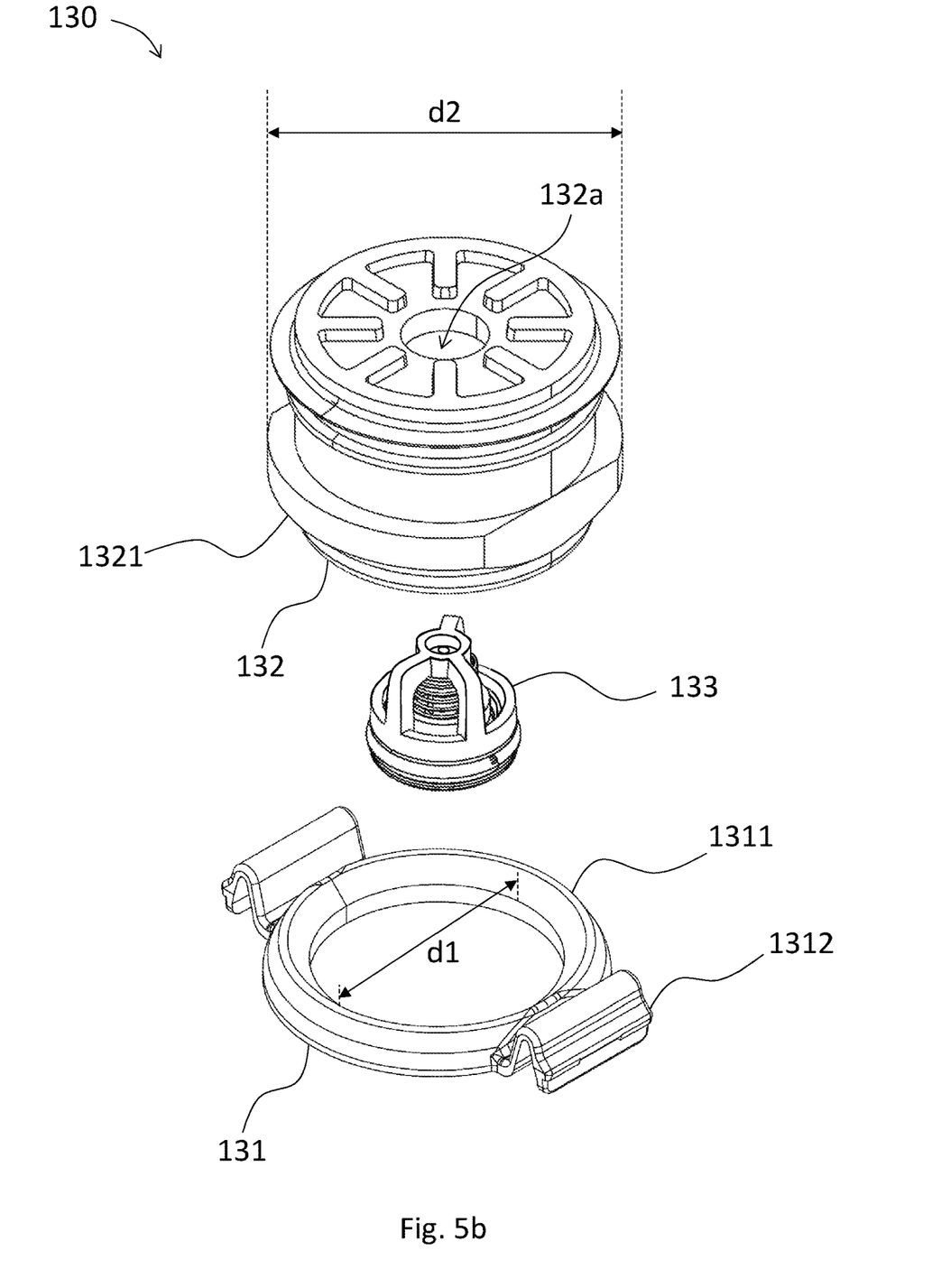

Please refer to FIG. 5a and FIG. 5b at the same time. FIG. 5a is a perspective view of the quick release purge valve according to one embodiment of the invention. FIG. 5b is an exploded view of the quick release purge valve of FIG. 5a. In the quick release purge valve 130 of the present embodiment, the snap plate 131 includes a main body 1311 and an elastic arm 1312. The main body 1311 is used to hold and fix to one side of the gasket fitting 132; in other words, the gasket fitting 132 abuts against the main body 1311 and therefore can be fixed. The main body 1311 of the present embodiment has a circular structure configured to surround the gasket fitting 132. The circular structure is also configured to avoid the airflow conduit 132a, so as not to interfere with the airflow of the gas.

Please refer to FIG. 4, FIG. 5a, and FIG. 5b at the same time. One end of the elastic arm 1312 is connected to the main body 1311, and the other end is used for engaging with the bottom plate 110. In the present embodiment, the snap plate 131 is exemplified by having two elastic arms 1312 connecting to two opposite sides of the main body 1311. The snap plate 131 can therefore be firmly engaged with the bottom plate 110. The elastic arm 1312 has a curved section which is used to be elastically deformed to achieve snapping or elastically engaging with the bottom plate 110. The curved section recesses into the base 11, so the structure of the elastic arm 1312 is at most evenly aligned with the bottom of the bottom plate 110 (i.e. the elastic arm 1312 is not protruded from the bottom plate 110). As a result, the bottom of the substrate container 10 can be kept flat (as the substrate container 10 shown in FIG. 1) to facilitate the transportation of the substrate container 10, and the flat bottom of the base 11 can also help maintain the cleanliness.

Of the quick release purge valve 130 according to the present embodiment of the invention, the gasket fitting 132 has a protruded ring 1321 situating on an outer wall of the gasket fitting 132. An outer diameter d2 of the protruded ring 1321 is larger than an inner diameter d1 of the main body 1311 of the snap plate 131, so the gasket fitting 132 can be prevented from going through the circular structure of the main body 1311 and can be effectively held and fixed by the main body 1311.

In the quick release purge valve 130 of the present embodiment, the valve element 133 is a check valve that can prevent reverse flow of the gas. Exemplarily, as shown in FIG. 5b, the valve element 133 allows the gas flows into the substrate container 10 (the substrate container 10 is shown in FIG. 1) only in the direction from bottom to top.

Figure 6:
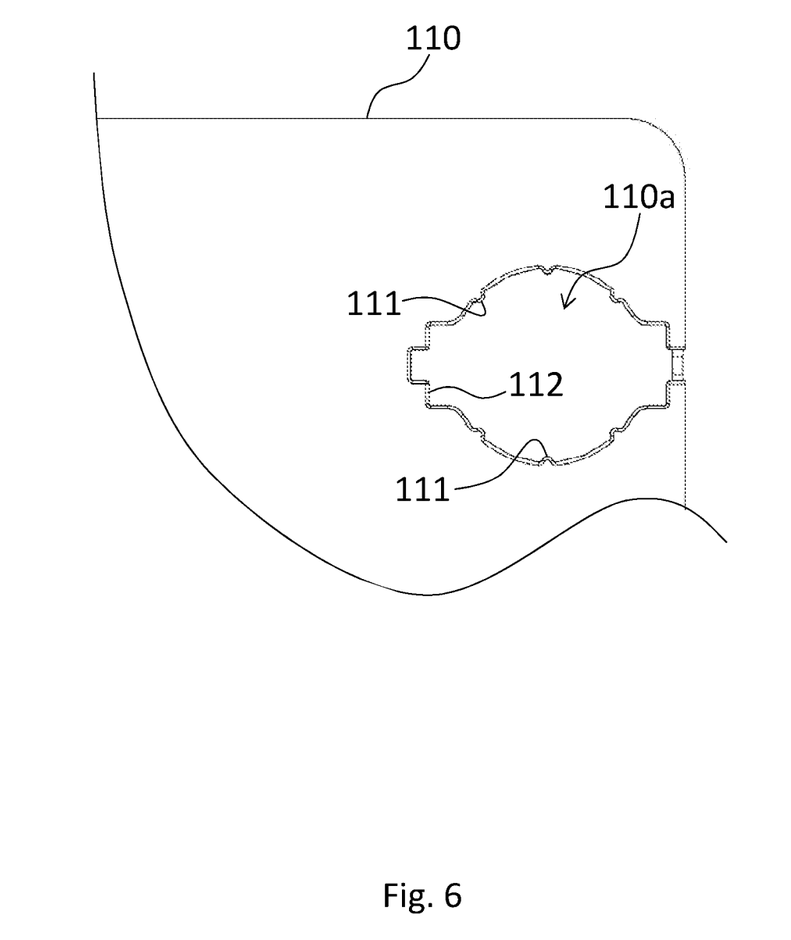
FIG. 6 is a perspective view of the bottom plate near one of the first openings.

Please refer to FIG. 3, FIG. 5b, and FIG. 6 at the same time. FIG. 6 is a perspective view of the bottom plate near one of the first openings. The snap plate 131 and the bottom plate 110 shown in FIG. 6 are in the disengaged state; that is, the snap plate 131 is not engaged with the bottom plate 110. The bottom plate 110 has a protruded edge 111 and an engaging recess 112 at the first opening 110a. The protruded edge 111 is used for fixing the location of the main body 1311 in the first opening 110a. The engaging recess 112 is used for engaging with the elastic arm 1312, thereby engaging the snap plate 131 with the bottom plate 110. In the present embodiment, the bottom plate 110 has several protruded edges 111 distributing along the first opening 110a to contact and fix the main body 1311 from multiple directions. The number of the engaging recess 112 corresponds to the elastic arm 1312, so each elastic arm 1312 could be engaged with one engaging recess 112.

The description of the embodiment continues with reference to FIG. 4 and FIG. 5b. As aforementioned, one side of the gasket fitting 132 abuts against the main body 1311 of the snap plate 131. In the present embodiment, the other side of the gasket fitting 132 is used for pressing against the cover plate 120 in proximity to a second opening 120a of the cover plate 120. The gas enters or leaves the substrate container 10 through the first opening 110a, the airflow conduit 132a, and the second opening 120a, or vice versa.

In the present embodiment, the cover plate 120 has a fitting sleeve 121 surrounding the second opening 120a. The gasket fitting 132 is used for slidably fitting with or removing from the fitting sleeve 121. When the gasket fitting 132 is fitted with the fitting sleeve 121, an air-tight state is formed between the fitting sleeve 121 and the outer wall of the gasket fitting 132. The gas leakage resulted from gas flowing into the space between the cover plate 120 and the bottom plate 110 can be prevented.

In the present embodiment, the base 11 further includes a filtration element 140 disposed between the cover plate 120 and the gasket fitting 132 for filtering the gas. When the snap plate 131 and the bottom plate 110 are in the disengaged state, the gasket fitting 132 is slidable and removable from the fitting sleeve 121, and the gasket fitting 132 can be completely removed from the base 11. After the gasket fitting 132 is removed from the base 11, the filtration element 140 can be replaced accordingly. By using a newly replaced or clean filtration element 140, the cleanliness of the gas can be kept. The filtration element 140 can be exemplified by filter paper, or other woven or non-woven fabric. Other porous material capable of filtering out particles can also be implemented in the present invention. To sum up, by using the detachable snap plate 131, the gasket fitting 132 can be removed easily, and the filtration element 140 or other related components can be replaced easily. The convenience of component replacement is increased, the work efficiency is improved, and the substrate container 10 (shown in FIG. 1) can return to the manufacturing line in a shorter time to carry on the function of containing, supporting, or transporting the substrate 20 (shown in FIG. 1).

According to the above-mentioned quick release purge valve and substrate container using the same of the embodiments of the invention, the quick release purge valve allows the gas entering or leaving the substrate container. The substrate container includes the base, and the base includes the cover plate and the bottom plate. The quick release purge valve includes the snap plate, the gasket fitting, and the valve element. The snap plate is detachably engaged to the first opening of the bottom plate and is at most evenly aligned with the bottom plate. The gasket fitting is disposed between the cover plate and the bottom plate and has the airflow conduit communicating the cover plate and the bottom plate. The valve element is disposed in the airflow conduit for limiting the flow direction of the gas. When the snap plate and the bottom plate are in the engaged state, the gasket fitting is fixed by the snap plate and is prevented from moving out of the base. When the snap plate and the bottom plate are in the disengaged state, the gasket fitting is removable from the base. In the quick release purge valve, the snap plate is used to increase the convenience of component replacement, to save work time, and to improve the work efficiency. Further, because the snap plate is at most evenly aligned with the bottom plate, the bottom of the substrate container can be kept flat, which facilitates the transporting of the substrate container and maintains the cleanliness as well.

The ordinal numbers used in the detailed description and claims, such as "first" and "second" do not necessarily indicate their priority orders or up and down directions; on the contrary, they are merely intended to distinguish different elements. It will be apparent to those skilled in the art that various modifications and variations can be made to the structure of the present invention without departing from the scope or spirit of the invention. In view of the foregoing, it is intended that the present invention covers modifications and variations of this invention, provided they fall within the scope of the following claims.

What is claimed is:

1. A quick release purge valve configured to allow a gas entering or leaving a substrate container that includes a base having a cover plate and a bottom plate, the quick release purge valve comprising:
   a snap plate detachably engaged to a first opening of the bottom plate and being at most evenly aligned with the bottom plate wherein the snap plate comprises a main body and an elastic arm, the main body is used for fixing to one side of the gasket fitting, and one end of the elastic arm is connected to the main body and the other end of the elastic arm is used for engaging with the bottom plate;
   a gasket fitting disposed between the cover plate and the bottom plate and having an airflow conduit communicating the cover plate and the bottom plate; and
   a valve element disposed in the airflow conduit for limiting a flow direction of the gas;
   wherein the gasket fitting is configured to be fixed in the base when the snap plate and the bottom plate are in an engaged state and to be removable from the base when the snap plate and the bottom plate are in a disengaged state.

2. The quick release purge valve according to claim 1, wherein the main body has a circular structure, and the circular structure is configured to surround the gasket fitting and to avoid the airflow conduit.

3. The quick release purge valve according to claim 2, wherein the gasket fitting has a protruded ring situated on an outer wall of the gasket fitting, and an outer diameter of the protruded ring is larger than an inner diameter of the main body.

4. The quick release purge valve according to claim 1, wherein the bottom plate has a protruded edge and an engaging recess, the protruded edge is used for fixing a location of the main body in the first opening, and the engaging recess is used for engaging with the elastic arm thereby engaging the snap plate with the bottom plate.

5. The quick release purge valve according to claim 1, wherein the other side of the gasket fitting is used for pressing against the cover plate in proximity to a second opening of the cover plate, and the gas enters or leaves the substrate container through the first opening, the airflow conduit, and the second opening.

6. The quick release purge valve according to claim 5, wherein the cover plate has a fitting sleeve surrounding the second opening, and the gasket fitting is used for slidably fitting with or removing from the fitting sleeve.

7. The quick release purge valve according to claim 6, wherein when the gasket fitting is fitted with the fitting sleeve, an air-tight state is formed between the fitting sleeve and an outer wall of the gasket fitting.

8. A substrate container comprising an inner box assembly for accommodating a substrate and an outer box assembly for accommodating the inner box assembly, the outer box assembly comprising:
   a base comprising a bottom plate having a first opening, a cover plate, and a quick release purge valve configured to allow a gas entering or leaving the substrate container, the quick release purge valve comprising:
      a snap plate detachably engaged to the first opening and being at most evenly aligned with the bottom plate, wherein the snap plate comprises a main body and an elastic arm, the main body is used for fixing to one side of the gasket fitting, and one end of the elastic arm is connected to the main body and the other end of the elastic arm is used for engaging with the bottom plate;
      a gasket fitting disposed between the cover plate and the bottom plate and having an airflow conduit communicating the cover plate and the bottom plate; and
      a valve element disposed in the airflow conduit for limiting a flow direction of the gas; and
   an outer cover for engaging with the base to form a sealed state therebetween;
   wherein the gasket fitting is configured to be fixed in the base when the snap plate and the bottom plate are in an engaged state and to be removable from the base when the snap plate and the bottom plate are in a disengaged state.

9. The substrate container according to claim 8, wherein the base further comprises a filtration element disposed between the cover plate and the gasket fitting for filtering the gas.

* * * * *